(12) United States Patent
Haraguchi

(10) Patent No.: US 11,924,960 B2
(45) Date of Patent: Mar. 5, 2024

(54) CIRCUIT BOARD AND METHOD FOR MANUFACTURING CIRCUIT BOARD

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 937 days.

(21) Appl. No.: 16/767,951

(22) PCT Filed: Nov. 8, 2018

(86) PCT No.: PCT/JP2018/041506
§ 371 (c)(1),
(2) Date: Dec. 3, 2020

(87) PCT Pub. No.: WO2019/107106
PCT Pub. Date: Jun. 6, 2019

(65) Prior Publication Data
US 2023/0247754 A1 Aug. 3, 2023

(30) Foreign Application Priority Data
Nov. 28, 2017 (JP) .................. 2017-228223

(51) Int. Cl.
*H05K 1/02* (2006.01)
*H01L 23/367* (2006.01)
*H05K 1/18* (2006.01)
*H05K 3/00* (2006.01)
*H05K 7/20* (2006.01)

(52) U.S. Cl.
CPC ......... *H05K 1/0204* (2013.01); *H01L 23/367* (2013.01); *H05K 1/18* (2013.01); *H05K 3/007* (2013.01); *H05K 7/2039* (2013.01); *H05K 2201/10166* (2013.01); *H05K 2201/10916* (2013.01)

(58) Field of Classification Search
CPC ..... H05K 1/021; H05K 1/0203; H05K 1/0209
See application file for complete search history.

(56) References Cited

U.S. PATENT DOCUMENTS

| 2002/0051342 A1 | 5/2002 | Kanada | |
| 2003/0100197 A1* | 5/2003 | Veitschegger | H05K 3/429 439/55 |
| 2005/0073039 A1* | 4/2005 | Kasuya | H01L 24/32 257/690 |
| 2010/0254093 A1 | 10/2010 | Oota et al. | |

FOREIGN PATENT DOCUMENTS

| JP | S63-278261 A | 11/1988 |
| JP | H9-321395 A | 12/1997 |

* cited by examiner

*Primary Examiner* — Jeremy C Norris
(74) *Attorney, Agent, or Firm* — Honigman LLP

(57) ABSTRACT

Provided is a circuit board on which a circuit component is mounted on one side, and a recess is formed at a position corresponding to the circuit component on the other side, and the circuit board includes a first heat conductive member that is provided inside the recess and conducts heat generated by the circuit component.

13 Claims, 9 Drawing Sheets

CIRCUIT BOARD AND METHOD FOR MANUFACTURING CIRCUIT BOARD

CROSS-REFERENCE TO RELATED APPLICATIONS

This application is the U.S. national stage of PCT/JP2018/041506 filed on Nov. 8, 2018, which claims priority of Japanese Patent Application No. JP 2017-228223 filed on Nov. 28, 2017, the contents of which are incorporated herein.

TECHNICAL FIELD

The present disclosure relates to a circuit board and a method for manufacturing a circuit board.

BACKGROUND

An electric circuit device is known which includes a heat receiving surface that receives heat from a heat generating element such as a semiconductor, a heat dissipation portion which dissipates heat conducted from the heat receiving surface, and a heat conductive member provided between the heat receiving surface and the heat dissipation portion (heat dissipation plate) and promotes heat conduction between the heat receiving surface and the heat dissipation portion (see JP 2002-93962A, for example).

A heat dissipation plate of an electric circuit device described in JP 2002-93962A is provided with a through hole (penetrating hole), and if the heat conductive member expands or contracts due to heat from a heat generating element, the heat conductive member progresses or retracts inside the through hole, thereby preventing a phenomenon (pump-out) in which air bubbles intrude into the heat conductive member.

With the electric circuit device described in JP 2002-93962A, since the through hole is provided in the heat dissipation plate, there are problems in that the configuration of the heat dissipation plate is complicated, and furthermore, the heat dissipation plate is required to have a thickness that corresponds to a length in an axial direction of the through hole, in order to permit the heat conductive member to progress and retract inside the through hole. Furthermore, there is another problem in that the axial direction of the through hole cannot be set to a gravity direction when the electric circuit device is arranged.

An object of this disclosure is to provide a circuit board and the like that can suppress a phenomenon in which air bubbles intrude in the heat conductive member with a simple configuration.

SUMMARY

A circuit board according to one aspect of this disclosure is a circuit board on which a circuit component is mounted on one side, in which a recess is formed at a position corresponding to the circuit component on the other side, and the circuit board includes a first heat conductive member that is provided inside the recess and conducts heat generated by the circuit component.

A method for manufacturing a circuit board according to one aspect of this disclosure includes steps of; arranging a plurality of conductive plates at a predetermined position of a metal mold, injecting resin into the metal mold to form a holding member having a recess that corresponds to a position of a circuit component to be mounted, while forming the plurality of conductive plates and the holding member in one piece; applying a conductive material in a region of the conductive plates on which a terminal of a circuit component is to be mounted; aligning the terminal of the circuit component with the conductive material and mounting the terminal of the circuit component on the conductive plate, introducing and heating, in a reflow furnace, the plurality of conductive plates and the holding member formed in one piece in a state where the circuit component is placed, melting the conductive material to solder the terminal of the circuit component to the conductive plate; and attaching the heat dissipation plate on which a heat conductive member is applied on one side to a surface of the plurality of conductive plates and the holding member formed in one piece, on which the recess is formed.

According to this disclosure, a circuit board and the like that can suppress the phenomenon that air bubbles intrude in the heat conductive member can be provided with a simple configuration.

DETAILED DESCRIPTION OF PREFERRED EMBODIMENTS

Figure 1:
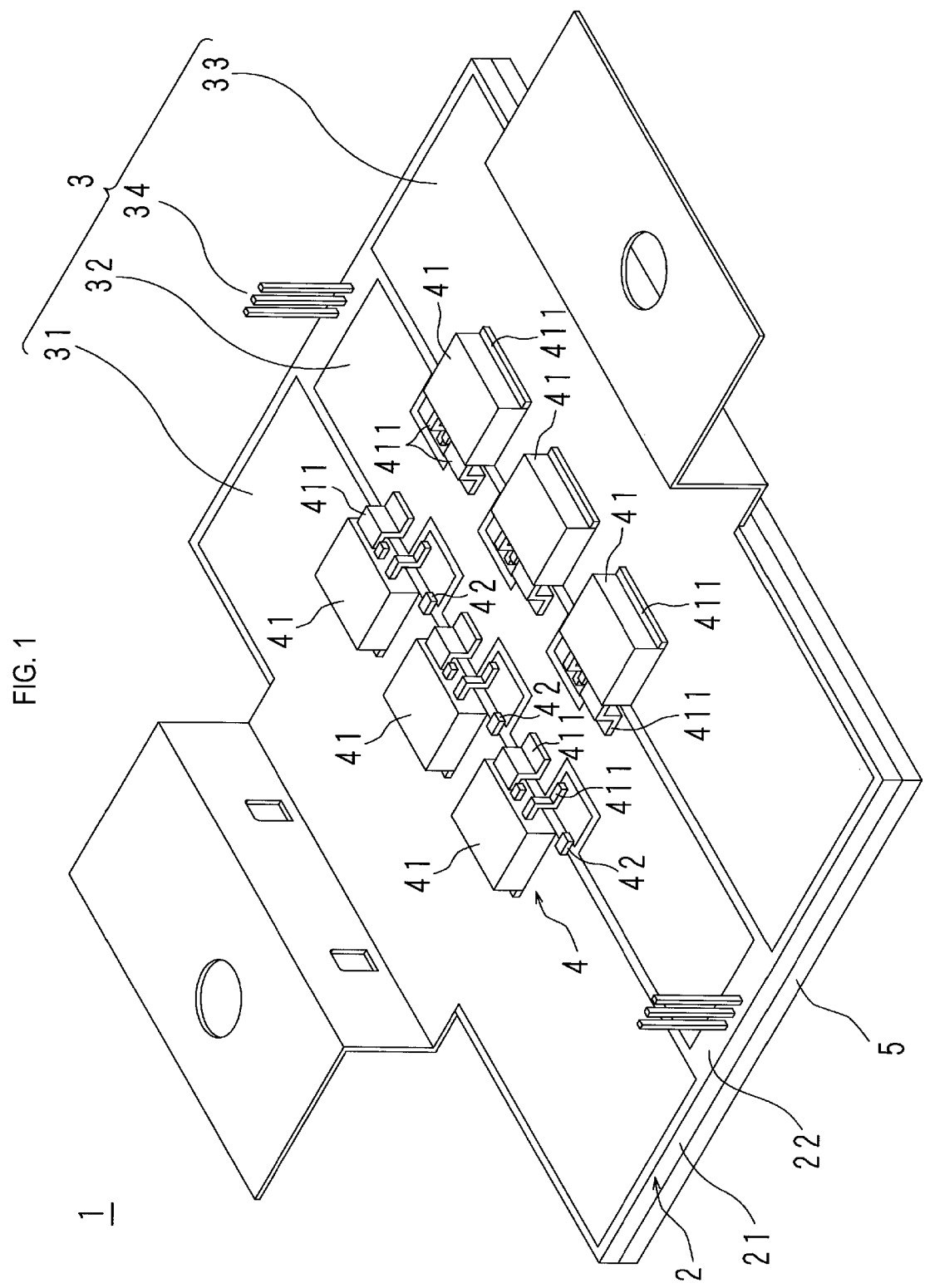
FIG. 1 is a perspective view showing a circuit board according to a first embodiment.

First, embodiments of this disclosure will be listed and described below. At least some of the embodiments described below may also be combined as appropriate.

A circuit board according to one aspect of this disclosure is a circuit board on which a circuit component is mounted on one side and in which a recess is formed at a position corresponding to the circuit component on the other side, and the circuit board includes a first heat conductive member that is provided inside the recess and conducts heat generated by the circuit component.

In this aspect, since the recess is formed on the other side of the circuit board corresponding to the position of the circuit component to be mounted, the size of the recess can be small corresponding to the size of the circuit component, and an influence due to the difference in the linear expansion coefficients of the circuit board can be reduced, making it possible to suppress intrusion of air bubbles into the first heat conductive member (pump-out).

A configuration is preferable in which at least a part of the circuit component overlaps the recess in a plan view.

In this aspect, since at least a part of the circuit component overlaps the recess in a plan view, the distance of heat conduction can be made shorter, making it possible to efficiently conduct heat from the circuit component to the first heat conductive member provided inside the recess.

A configuration is preferable in which the circuit board includes a heat dissipation plate provided on the other side, and the first heat conductive member is sealed by the heat dissipation plate and the recess.

In this aspect, since the circuit board is provided with the heat dissipation plate, and the first heat conductive member is sealed by the one side of the heat dissipation plate and the recess, even if the first heat conductive member is heated due to heat from the circuit component, the flow of the first heat conductive member can be restricted, and the intrusion of air bubbles into the first heat conductive member can be further suppressed. Heat from the circuit component can be efficiently dissipated from the heat dissipation plate via the first heat conductive member.

A configuration is preferable in which the circuit component includes a plurality of semiconductor switches, and the number of the recesses is at least the number of the semiconductor switches.

In this aspect, since the circuit component includes a plurality of semiconductor switches, and the number of the recesses is at least the number of the semiconductor switches, it is possible to efficiently conduct heat from the semiconductor switches that generate a lot of heat to the first heat conductive member.

A configuration is preferable in which the recess is formed by a partitioning wall provided on the other side.

In this aspect, since the recess is formed by the partitioning wall provided on the other side, it is possible to form the recess on the other side of the circuit board with a simple configuration.

A configuration is preferable in which the circuit board includes a heat dissipation plate provided on the other side, and a conductive plate on which a terminal of the circuit component is mounted, and the height of the partitioning wall is set so that a distance between the conductive plate and the heat dissipation plate is a predetermined insulation distance.

In this aspect, by setting the height of the partitioning wall so that the space between the conductive plate on which the terminal of the circuit component is placed and the heat dissipation plate is a predetermined insulation distance, it is possible to secure the insulation between the conductive plate and the heat dissipation plate with a simple configuration.

A configuration is preferable in which a protrusion is formed along the circumferential edge of the other side, and a second heat conductive member is provided between an inner face of the protrusion and an outer wall face of the partitioning wall.

In this aspect, since the protrusion is formed along the circumferential edge of the other side of the circuit board, and the second heat conductive member is provided between the inner face of the protrusion and the outer wall face of the partitioning wall, it is possible to conduct heat from the circuit component further efficiently.

A method for manufacturing a circuit board according to one aspect of this disclosure includes step of arranging a plurality of conductive plates at a predetermined position of a metal mold, injecting resin into the metal mold to form a holding member having a recess that corresponds to a position of a circuit component to be mounted, while forming the plurality of conductive plates and the holding member in one piece, applying a conductive material in a region of the conductive plates on which a terminal of a circuit component is to be mounted, aligning the terminal of the circuit component with the conductive material and mounting the terminal of the circuit component on the conductive plate, introducing and heating, in a reflow furnace, the plurality of conductive plates and the holding member formed in one piece in a state where the circuit component is placed, melting the conductive material to solder the terminal of the circuit component to the conductive plate; and attaching the heat dissipation plate on which a heat conductive member is applied on one side to a surface of the plurality of conductive plates and the holding member formed in one piece, on which the recess is formed.

In this aspect, it is possible to manufacture the circuit board according to one aspect of this disclosure with a simple method, in which the holding member having the recess at a position corresponding to the circuit component to be mounted is formed, the plurality of conductive plates and the holding member are formed in one piece, and the heat dissipation plate on which the heat conductive member are applied on the one side is adhered to the surface of the plurality of conductive plates and the holding member formed in one piece, on which the recess is formed.

Specific examples of a circuit board and a method for manufacturing the circuit board according to this disclosure will be described with reference to the drawings below. Note that the present disclosure is not limited to these examples, and is defined by the claims, and all changes within the meaning and range of equivalency of the claims are intended to be embraced therein.

First Embodiment

FIG. 1 is a perspective view showing a circuit board according to a first embodiment. A circuit board 1 is provided with a holding member 2 and a plurality of bus bars 3 held by the holding member 2. A plurality of circuit components 4 are placed on one side of the plurality of bus bars 3. The other side of the bus bars 3 faces the one side of the heat dissipation plate 5. The circuit board 1 is mounted in an electrical junction box (not shown) and used as a power supply device for a vehicle, for example.

The circuit components 4 include semiconductor switches 41 and chip components 42. The semiconductor switches 41 are, for example, n-channel FETs that each have a drain terminal, a source terminal, and a gate terminal. The chip components 42 are, for example, small components such as chip resistors that each have two terminals. The circuit components 4, such as the semiconductor switches 41, are placed on one of the bus bars 3 corresponding to its terminals 411 and installed on the circuit board 1. Since a conductive material 7 such as a solder paste (see FIG. 6) is applied in the regions of the bus bars 3 on which the terminals 411 are mounted, the terminals 411 of the circuit components 4, such as the semiconductor switches 41, and the bus bars 3 are joined together by a solder and electrically connected to each other.

Figure 2A:
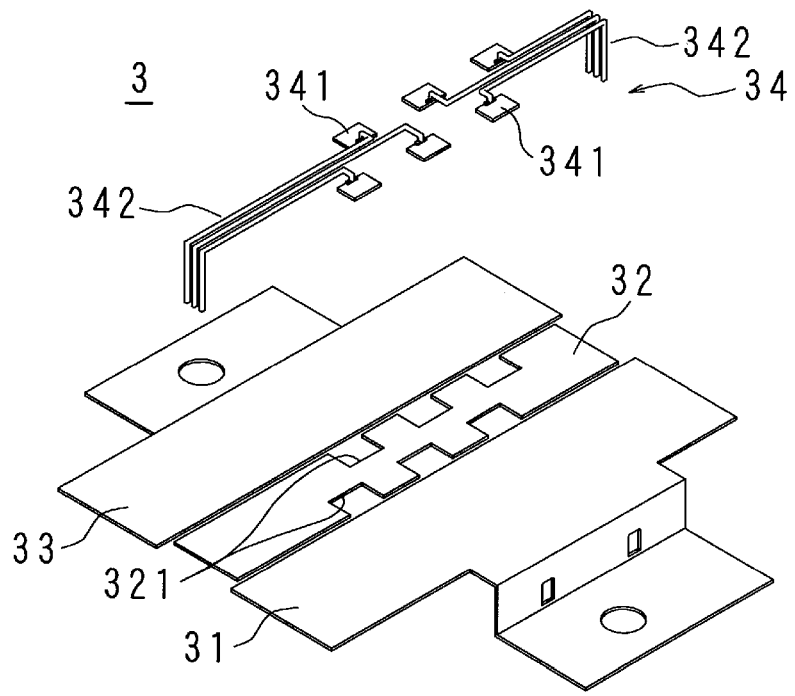
FIG. 2A is a diagram illustrating a configuration of bus bars.
Figure 2B:
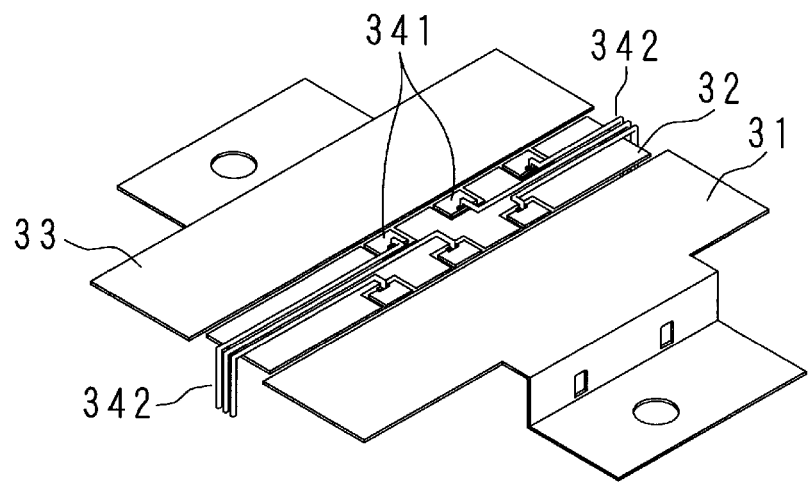
FIG. 2B is a diagram illustrating a configuration of the bus bars.
Figure 2C:
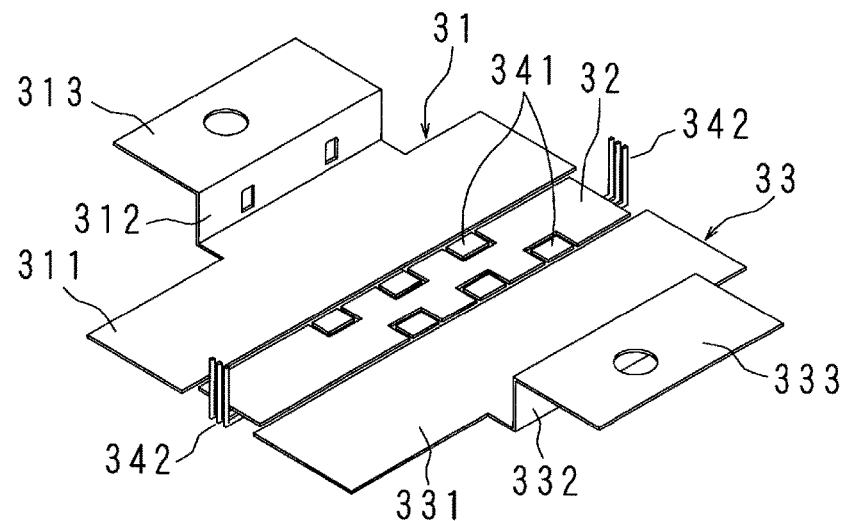
FIG. 2C is a diagram illustrating a configuration of the bus bars.
Figure 3:
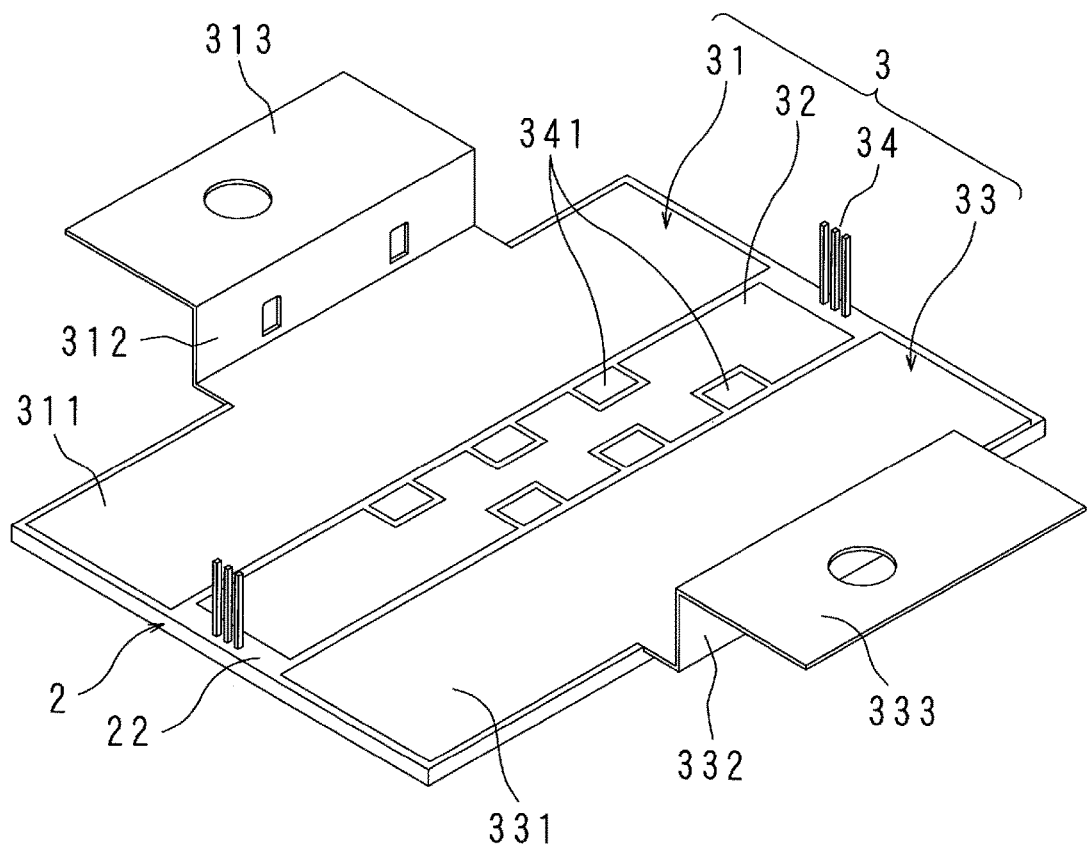
FIG. 3 is a perspective view showing how the bus bars and a holding member are formed in one piece, seen from one side.
Figure 4:
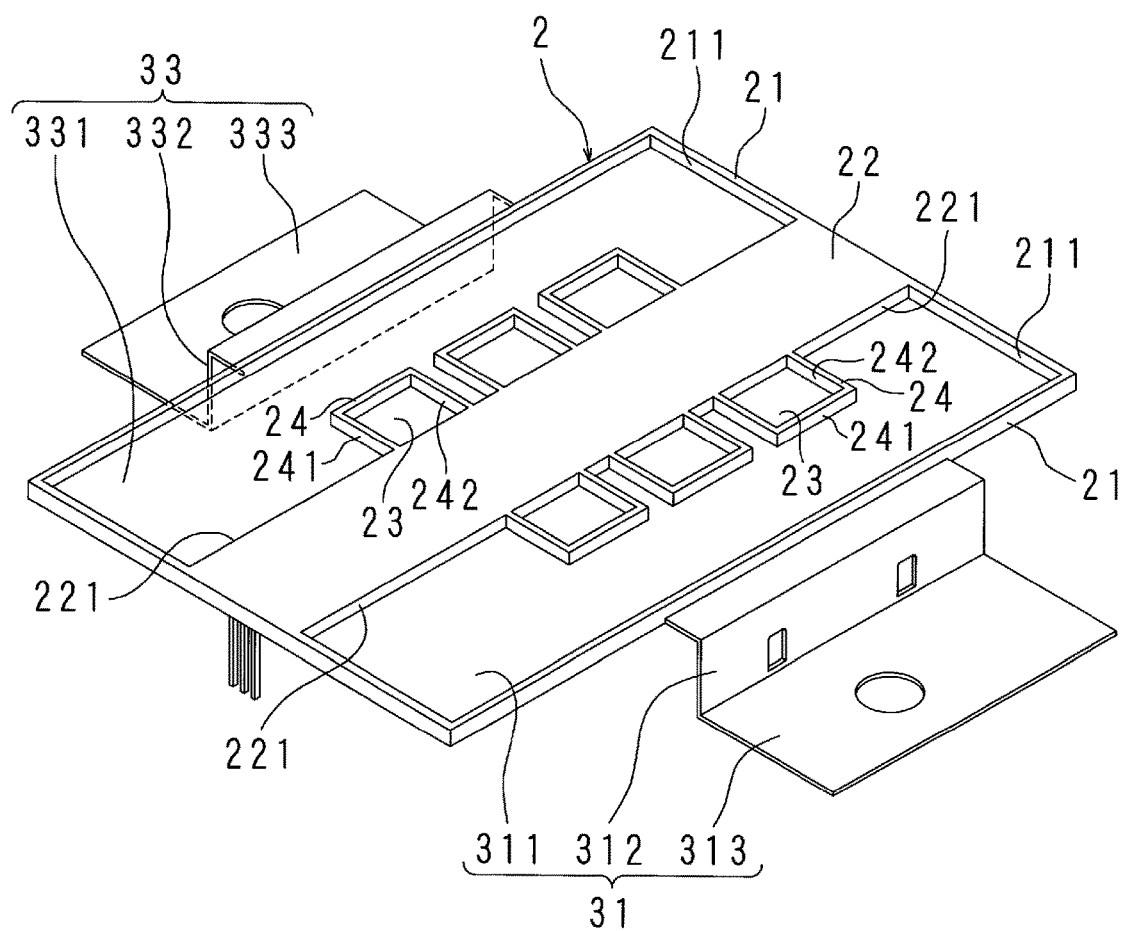
FIG. 4 is a perspective view showing how the bus bars and the holding member are formed in one piece, seen from another side.

FIGS. 2A, 2B and 2C are diagrams illustrating a configuration of the bus bars. FIG. 3 is a schematic view showing how the bus bars and the holding member are formed in one piece, seen from the one side. FIG. 4 is a schematic view showing how the bus bars and the holding member are formed in one piece, seen from the other side.

The bus bars 3 include an input bus bar 31, a connection bus bar 32, an output bus bar 33, and terminal bus bars 34. The bus bars 3 are made of a highly conductive metal such as copper.

The input bus bar 31 and the output bus bar 33 respectively include placement portions 311 and 331 shaped like rectangular plates, on which the circuit components 4 are placed, rising portions 312 and 332 that rise substantially upright from outer edges of the placement portions 311 and 331, and extending portions 313 and 333 that extend outward from the top edges of the rising parts 312 and 332. The input bus bar 31 and the output bus bar 33 are held by the holding member 2 with the placement portions 311 and 331 arranged in parallel with each other.

The rectangular plate-like connection bus bar 32 is provided between the placement portion 311 of the input bus bar 31 and the placement portion 331 of the output bus bar 33. The longitudinal edges of the connection bus bar 32 each have three cutout portions 321. In the connection bus bar 32, the cutout portions 321 that face the input bus bar 31 and the output bus bar 33 are provided in the longitudinal edges. The input bus bar 31, the connection bus bar 32, and the output bus bar 33 are arranged in this order and in parallel with each other, and held by the holding member 2 with one side thereof on which the circuit components 4 are placed being arranged in the same direction.

The terminal bus bars 34 include terminal placement portions 341 shaped like rectangular plates, and rod portions 342 each extending from one edge of each terminal placement portion 341 (see FIG. 2A). The number of terminal bus bars 34 is six, which is in accordance with the number of the cutout portions 321 provided in the connection bus bar 32. The terminal bus bars 34 are provided so that the terminal placement portions 341 are aligned with the cutout portions 321 provided in the connection bus bar 32 from the other side of the connection bus bar 32 (see FIGS. 2B and 2C). The front end portions of the rod portions 342 of the terminal bus bars 34 are bent so that they are substantially vertical to one side of the connection bus bar 32.

The holding member 2 is shaped like a rectangular frame, and preferably, made of a heat-resistant insulative resin such as polyphenylene sulfide resin, for example. The holding member 2 includes an outer frame 21 forming an outline of the holding member 2, and a wide columnar portion 22 that bridges the short sides of the outer frame 21. The side faces 221 of the columnar portion 22 are each provided with three partitioning walls 24 formed into a "]" shape that protrude toward the long sides of the outer frame 21 substantially at equal intervals in a plan view.

As shown in FIG. 4, the "]" shaped partitioning walls 24 each have three sides, and the three sides are comprised of two sides parallel to the short side of the outer frame 21 and one side provided between the two sides and parallel to the long side of the outer frame 21. Since the two sides parallel to the short side of the outer frame 21 protrude from the side face 221 of the columnar portion 22, a part of the side face 221 of the columnar portion 22 is located between the two sides. Later-described first heat conductive members 61 are provided in regions each surrounded by a part of the side face 221 of the columnar portion 22 and the three sides of each partitioning wall 24. Note that the shape of the partitioning walls 24 is not limited to a "]" shape in a plan view, and may also be rectangular or oval in a plan view, and regions in which the first heat conductive members 61 are provided may also be formed only by the partitioning walls 24.

As shown in FIG. 3, the input bus bar 31 is provided between one long side and the columnar portion 22 of the outer frame 21. The output bus bar 33 is provided between the other long side and the columnar portion 22 of the outer frame 21. The connection bus bar 32 is provided on one side of the columnar portion 22. In the terminal bus bars 34, the rod portions 342 and parts of the terminal placement portions 341 are embedded in the columnar portion 22, and one side of terminal placement portions 341 and the front ends of the rod portions 342 are exposed from the columnar portion 22.

In this manner, the outer frame 21 of the holding member 2 covers the outer circumference of the bus bars 3 formed by the input bus bar 31, the connection bus bar 32, the output bus bar 33, and the terminal bus bars 34. Opening portions formed by the outer frame 21 and the columnar portion 22 of the holding member 2 are covered by the input bus bar 31 and the output bus bar 33. The placement portion 311 of the input bus bar 31 and the placement portion 331 of the output bus bar 33, the one side of the connection bus bar 32, the terminal placement portions 341 of the terminal bus bars 34, and the one side of the columnar portion 22 are formed in a flat shape, and the holding member and the bus bars 3, such as the input bus bar 31, formed in one piece in this manner constitute the main body of the circuit board 1.

As shown in FIG. 4, as the outer frame 21 of the holding member 2 covers the outer circumference of the bus bars 3, a protrusion is formed by the outer frame 21 on the other side of the bus bars 3, in other words, on the circumferential edge on the other side of the placement portions of the input bus bar 31 and the output bus bar 33. In other words, the portion on the other side of the outer frame 21 corresponds to the protrusion provided at the circumferential edge of the other side of the circuit board 1 (the other side of the circuit board main body). Note that the circuit board main body formed by the bus bars 3 and the holding member 2 formed in one piece can be formed by integral molding using a resin mold, which will be described in detail in connection with the method for manufacturing the circuit board 1.

As shown in FIG. 4, the "]" shaped partitioning walls 24 are provided on the other side of the bus bars 3. Accordingly, rectangular recesses 23 are formed in regions each surrounded by a part of the side face 221 of the columnar portion 22 and the three sides of the partitioning wall 24. The inner circumferential face of each recess 23 is formed by the inner wall face 242 of the partitioning wall 24 and the side face 221 of the columnar portion 22. A bottom face of each recess 23 is formed by a region on the other side of the placement portions 311 and 331 of the bus bars 3 surrounded by a part of the side face 221 and the three sides of the partitioning wall 24.

The recesses 23 are located on the other side of the bus bars 3, and formed at positions corresponding to the positions of the circuit components 4 placed on the one side of the bus bars 3. In other words, in a plan view, the recesses 23 are provided so that at least parts of the bottom faces of the recesses 23 and the bottom faces of the packages of the corresponding circuit components 4 overlap each other. The shape and area of the bottom face of each recess 23 are substantially equal to or slightly larger than the shape and area of the bottom face of the package of the corresponding circuit component 4. In this case, it is preferable that the recesses 23 are provided so that the bottom face of each recess 23 substantially overlaps with the bottom face of the package of the corresponding circuit component 4 in a plan view. The number of the recesses 23 can be determined as appropriate based on the number of the semiconductor switches 41 mounted on the circuit board 1, for example, it may be at least the number of the semiconductor switches 41 that generate a lot of heat. It is also possible to provide recesses 23 that correspond to circuit components 4 other than the semiconductor switches 41 as appropriate.

Figure 5:
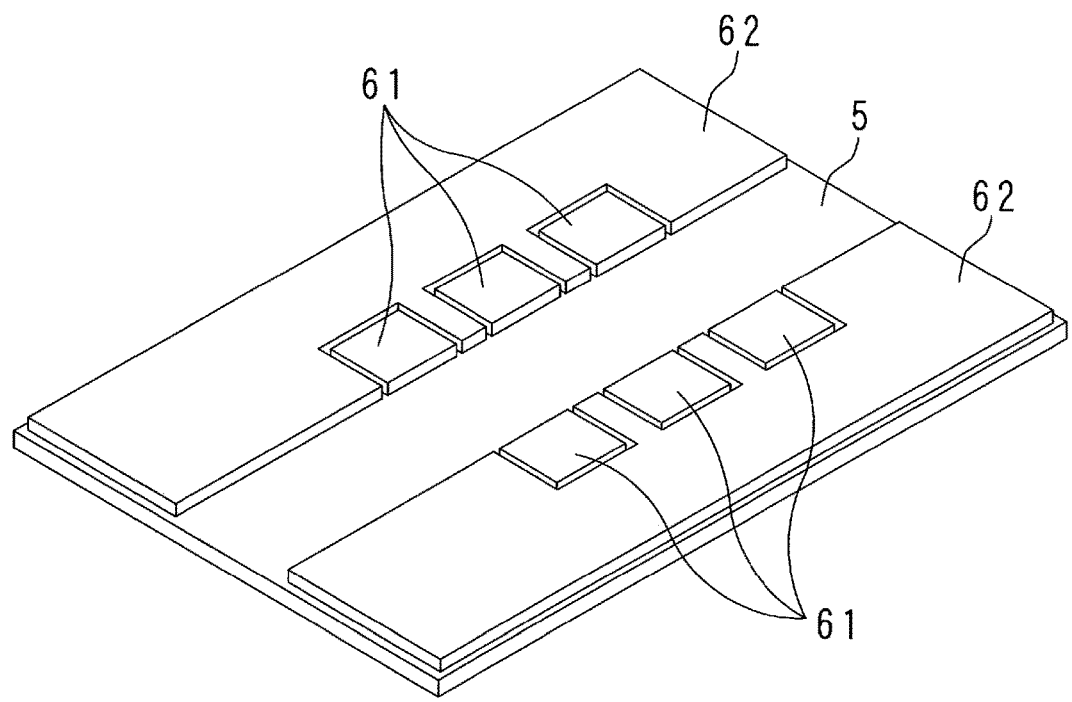
FIG. 5 is a perspective view showing how heat conductive members are applied to a heat dissipation plate.

FIG. 5 is a perspective view showing a state where heat conductive members 61 and 62 have been applied to a heat dissipation plate 5. The heat dissipation plate 5 is rectangular and made of a metal with good heat conductivity such as aluminum. The shape of the heat dissipation plate 5 in a plan view is substantially the same as the shape (shape of the outline formed by the outer frame 21) of the holding member 2.

The heat conductive members 61 and 62 are applied to the side (one side) of the heat dissipation plate 5 that faces the holding member 2. The heat conductive members 61 and 62 are highly heat conductive and insulative members made of a material such as heat dissipation grease. Preferably, the heat conductive members 61 and 62 are made of a heat conductive silicone composition, for example, having a heat conductivity rate of at least 2 W/m·k, and a viscosity of 50 to 500 Pa·s.

The heat conductive members 61 and 62 include first heat conductive members 61 and second heat conductive members 62. The first heat conductive members 61 are respectively located at positions corresponding to the recesses 23. The volume of each first heat conductive member 61 is substantially the same as or slightly smaller than the volume inside the recess 23. The second heat conductive members 62 are each provided at a position corresponding to a region surrounded by the outer wall face 241 of the partitioning wall 24, the inner face 211 of the outer frame 21 (protrusion), and the side face 221 excluding the part of the side face 221 that forms the recess 23. The volume of each second heat conductive member 62 is substantially the same or slightly smaller than a spatial volume obtained by multiplying the area of the region by the value obtained by subtracting the thickness of bus bars 3 from the thickness of the outer frame 21.

By attaching the heat dissipation plate 5 on which the heat conductive members 61 and 62 are provided on the one side onto the other side of the circuit board main body formed by the bus bars 3 and the holding member 2, the heat conductive members 61 and 62 are sealed in the space that is formed between the side face 221 of the columnar portion 22 and the inner face 211 of the outer frame 21 and that includes the recesses 23. Accordingly, the first heat conductive members 61 are sealed inside the corresponding recesses 23 with the heat dissipation plate 5. The second heat conductive members 62 are sealed inside the spaces corresponding to regions surrounded by the outer frame 21 and the columnar portion 22, respectively, with the heat dissipation plate 5. The first heat conductive members 61 and the second heat conductive members 62 are partitioned by the partitioning walls 24.

Figure 6:
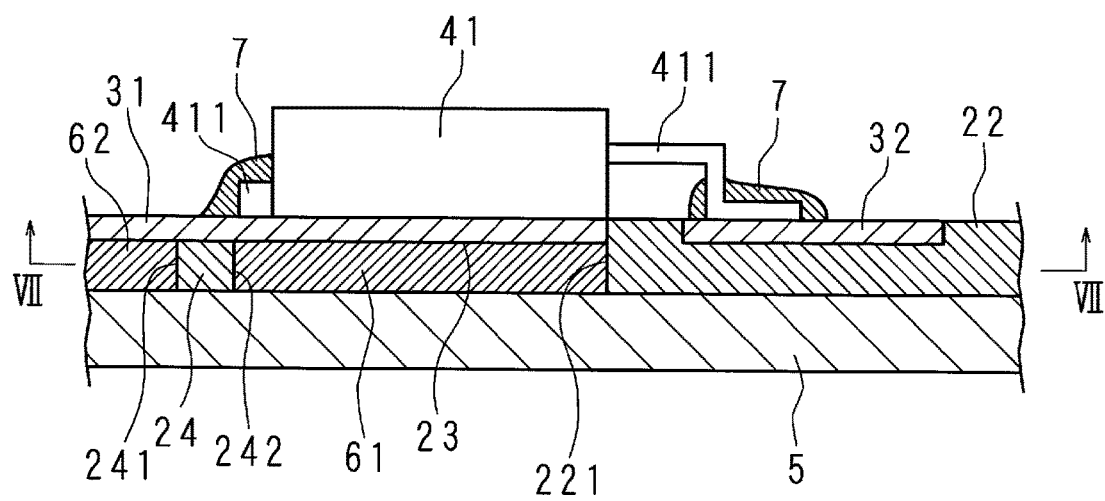
FIG. 6 is a schematic cross-sectional view of a main part of the circuit board.
Figure 7:
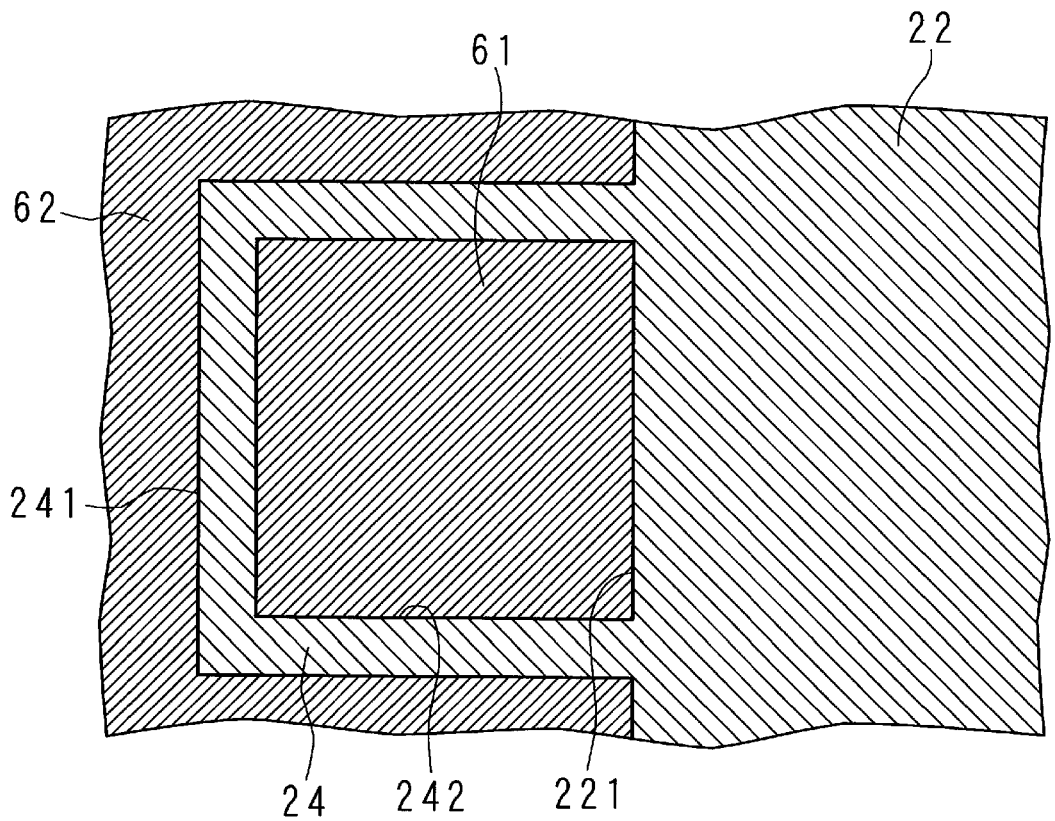
FIG. 7 is a partial vertical cross-sectional view taken along line VII-VII in FIG. 6.

FIG. 6 is a schematic cross-sectional view of a main part of the circuit board 1. FIG. 7 is a partial vertical cross-sectional view taken along line VII-VII in FIG. 6. Semiconductor switches 41 are each mounted on the circuit board 1 in a state where one terminal 411 is placed on the input bus bar 31 and the other terminal 411 is placed on the connection bus bar 32. The conductive material 7 such as a solder paste are applied to the regions of the input bus bar 31 and the connection bus bar 32 on which the terminals 411 are placed. By the terminals 411 and the input bus bar 31 being joined to the connection bus bar 32 by the solder paste welded in the reflow furnace, the terminals 411 are electrically connected to the input bus bar 31 and the connection bus bar 32. Each semiconductor switch 41 turns on or off in response to control signals output from a control element (not shown) and supplies/interrupts a flow of current between the input bus bar 31 and the connection bus bar 32.

The connection bus bar 32 is embedded in a recess provided on the one side of the columnar portion 22, and the one side of the connection bus bar 32, the one side of the columnar portion 22, and one side of the placement portion 331 of the input bus bar 31 are substantially flat. The input bus bar 31 is supported by the partitioning walls 24 of the holding member 2.

The recesses 23 are formed between the inner wall faces 242 of the partitioning walls 24 and the side faces 221 of the columnar portion 22 so that the recesses 23 are located directly under the semiconductor switches 41, and the semiconductor switches 41 overlap the recesses 23 in a plan view seen from the one side of the circuit board 1.

As shown in FIG. 7, each of the first heat conductive members 61 is provided on the inner wall face 242 side (in the recess 23) of the partitioning wall 24. Each second heat conductive member 62 is provided on the outer wall face 241 side of the partitioning wall 24.

The heat dissipation plate 5 is provided so that the one side thereof is in contact with the end face of the other side of the columnar portion 22 and the end faces on the other side of the partitioning walls 24. By the one side of the heat dissipation plate 5 coming in contact with the other side of the columnar portion 22 and the end faces on the other side of the partitioning walls 24, the first heat conductive members 61 and the second heat conductive members 62 are sealed.

The distance (height of the partitioning wall 24) between the partitioning wall 24 and the input bus bar 31 is set so that the space between the input bus bar 31 and the heat dissipation plate 5 is a predetermined insulation distance. A predetermined insulation distance is, for example, about 0.5 mm to 2 mm.

By the semiconductor switches 41 turning on, a current flows in the semiconductor switches 41 with power being supplied from a power source (not shown). Due to the current flowing in the semiconductor switches 41, the semiconductor switches 41 generate heat. Due to the heat generation by the semiconductor switches 41, the input bus bar 31, the holding member 2, and the heat dissipation plate 5 expand, and when the semiconductor switches 41 turn off, they are cooled by the ambient temperature and contract. Since the input bus bar 31, the holding member 2 and the heat dissipation plate 5 are made of different materials, their linear expansion coefficients differ from each other. In view of this, by filling the first heat conductive members 61 in the recesses 23 that are comparatively smaller regions corresponding to the size of the semiconductor switches 41, the influence of the difference in the linear expansion coefficients can be decreased. By decreasing the influence due to the difference in the linear expansion coefficients, pump-out can be suppressed, and a decrease in heat conductivity of the first heat conductive members 61 can be suppressed.

Since the first heat conductive members 61 are sealed in the recesses 23 by the heat dissipation plate 5, even if the first heat conductive members 61 are heated due to the heat generation by the semiconductor switches 41, the first heat conductive members 61 can be prevented from flowing, pump-out can be suppressed, and a decrease in heat-conductivity of the first heat conductive members 61 can be suppressed.

Since the recesses 23 are formed so that at least parts of the semiconductor switches 41 overlap the recesses 23 in a plan view, the heat conduction distance between the first heat conductive members 61 provided inside the recesses 23 and the semiconductor switches 41 can be decreased, making it possible to efficiently conduct heat from the semiconductor switches 41 to the first heat conductive member 61, and efficiently dissipate the heat from the heat dissipation plate 5 that is in contact with the first heat conductive members 61.

Since the number of the recesses 23 is at least the number of the semiconductor switches 41 mounted on the circuit board 1, the size of the recesses 23 (area in a plan view) can be decreased, and it is possible to efficiently conduct heat from the semiconductor switches 41 to the heat dissipation plate 5, for each semiconductor switch 41, while decreasing the influence due to the difference in the linear expansion coefficients.

Since the height of the partitioning walls 24 forming the recesses 23 is set so that the height is a predetermined insulation distance between the bus bars 3 and the heat dissipation plate 5, it is possible to ensure insulation between the bus bars 3 and the heat dissipation plate 5.

By the second heat conductive members 62 provided between the inner face 211 of the outer frame 21 and the side faces 221 of the columnar portion 22 and the outer wall faces 241 of the partitioning walls 24, heat conductivity can be improved, and heat from the circuit components 4 can be efficiently dissipated from the heat dissipation plate 5.

Note that although the shape and size of the bottom face of each recess 23 are substantially similar to the shape and size of the package of the corresponding circuit component 4, there is no limitation to this. The shape and size of the bottom face of the recesses 23 may also be set corresponding to the region where the plurality of circuit components 4 are mounted. If the circuit components 4 are comparatively small, by providing the recesses 23 corresponding to the circuit components 4, a simple configuration can be achieved.

The holding member 2 is not limited to a configuration that includes the outer frame 21 and the columnar portion 22 provided in the outer frame 21. The holding member 2 may also have a shape in which a base portion shaped like a rectangular plate in which the bus bars 3 are mounted on one side is included, and the recesses 23 are formed on the other side of the base portion. In this case, the bus bars 3 are embedded in the holding member 2 with the one side on which the circuit components 4 are placed being exposed. The recesses 23 formed on the other side of the base portion may also be formed by recessing the other side, or may also be formed by providing the partitioning walls shaped like squares in a plan view and which protrude from the other side, which serves as the base end, so as to surround the recesses 23 by the partitioning walls shaped like squares. Since the base portion is provided, the rigidity of the holding member 2 can be improved.

Although the shape of the heat dissipation plate 5 is substantially the same as the shape of the holding member 2 in a plan view (shape of the outline formed by the outer frame 21), there is no limitation to this. The heat dissipation plate 5 may also be larger than the outer frame of the holding member 2 in a plan view. The heat dissipation plate 5 may also be a part of a circuit device such as an electrical junction box, for example. A configuration is also possible in which the bus bars 3 and the holding member 2 (circuit board main body) formed in one piece on which the circuit components 4 are mounted are attached to one side of the heat dissipation plate 5 on which the recesses 23 are formed, and to arrange them in the electrical junction box.

FIGS. 8A to 8G are diagrams illustrating a method for manufacturing the circuit board. The method for manufacturing the circuit board 1 according to the first embodiment will be illustrated with reference to the FIGS. 8A to 8G.

Figure 8A:
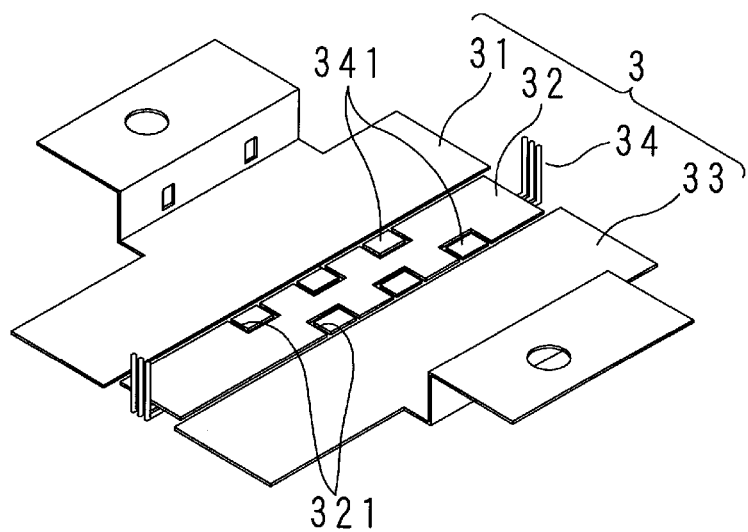
FIG. 8A is a diagram illustrating a method for manufacturing the circuit board.
Figure 8B:
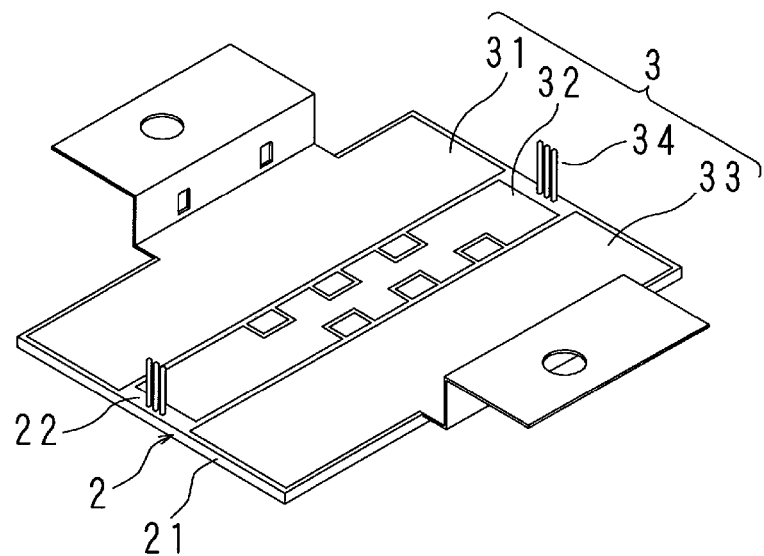
FIG. 8B is a diagram illustrating the method for manufacturing the circuit board.
Figure 8C:
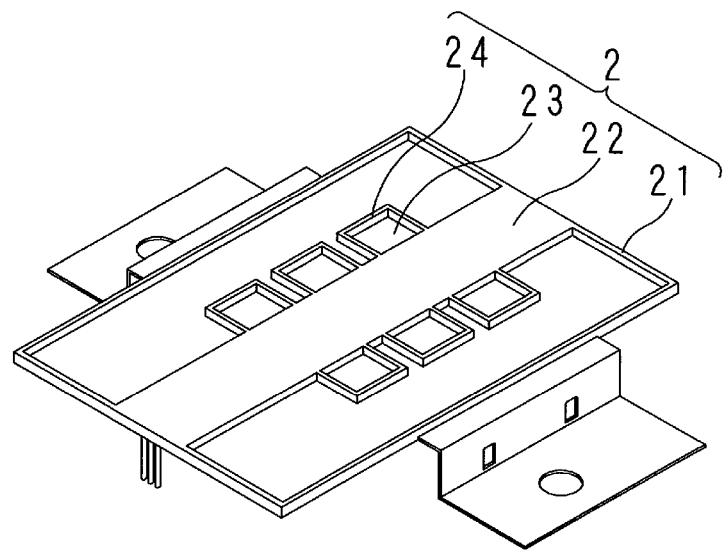
FIG. 8C is a diagram illustrating the method for manufacturing the circuit board.

First, the input bus bar 31, the connection bus bar 32, and the output bus bar 33 are arranged in this order, with their edges opposing each other and spaced apart from each other (see. FIG. 8A). Then, the terminal placement portions 341 of the terminal bus bars 34 are aligned with the corresponding cutout portions 321 in the connection bus bar 32 from the other side of the connection bus bar 32.

Next, the input bus bar 31, the connection bus bar 32, the output bus bar 33 and the terminal bus bars 34 arranged as above are disposed in a resin mold such as a mold for insert molding, and resin such as polyphenylene sulfide is poured into the mold. The poured resin flows along the path formed within the mold, and the holding member 2 including the outer frame 21, the columnar portion 22, and the partitioning walls 24 that form the recesses 23 are formed. The resin flow path in the mold is formed so that the circuit components 4 to be mounted overlap the recesses 23 in a plan view. The input bus bar 31, the connection bus bar 32, the output bus bar 33 and the terminal bus bars 34 are formed in one piece with the holding member 2 (subjected to insert molding, see FIG. 8B), and the circuit board main body on which the recesses 23 are formed on a side opposite to the side on which the circuit components 4 are mounted is formed (see FIG. 8C).

Figure 8D:
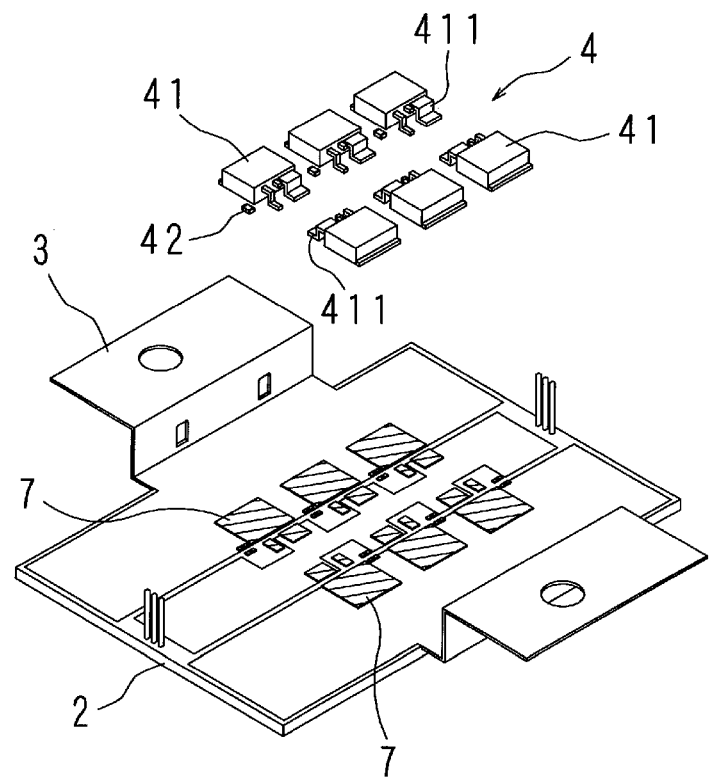
FIG. 8D is a diagram illustrating the method for manufacturing the circuit board.

Next, the conductive material 7 such as a solder paste are applied to the regions of the bus bar 3 on which the terminals 411 of the circuit components 4 are mounted (see FIG. 8D).

Figure 8E:
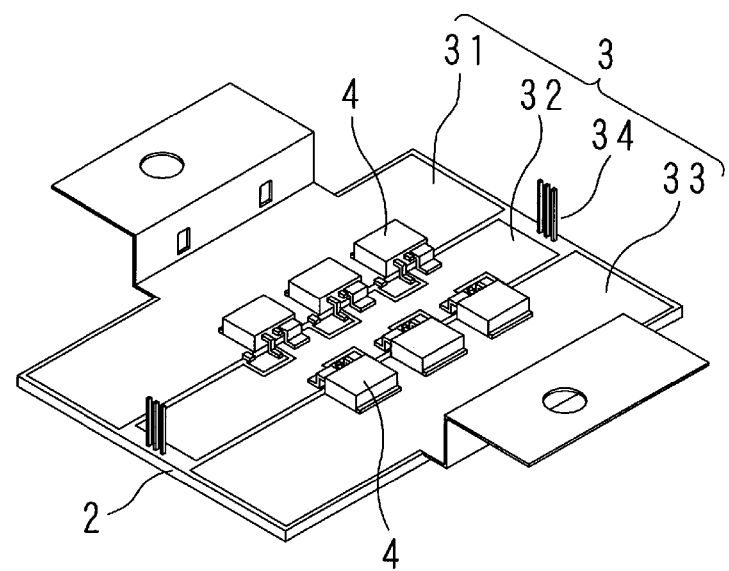
FIG. 8E is a diagram illustrating the method for manufacturing the circuit board.

Next, the terminals 411 of the circuit components 4 are aligned with the applied conductive material 7 such as a solder paste, and the terminals 411 are placed on the conductive material 7 (see FIGS. 8D and 8E).

Next, in a state where the circuit components 4 are placed (see FIG. 8E), the plurality of bus bars 3 and the holding member 2 (circuit board main body) formed in one piece are introduced into the reflow furnace and heated to melt the conductive material 7 and solder the terminals 411 of the circuit components 4 and the conductive plate to each other.

Figure 8F:
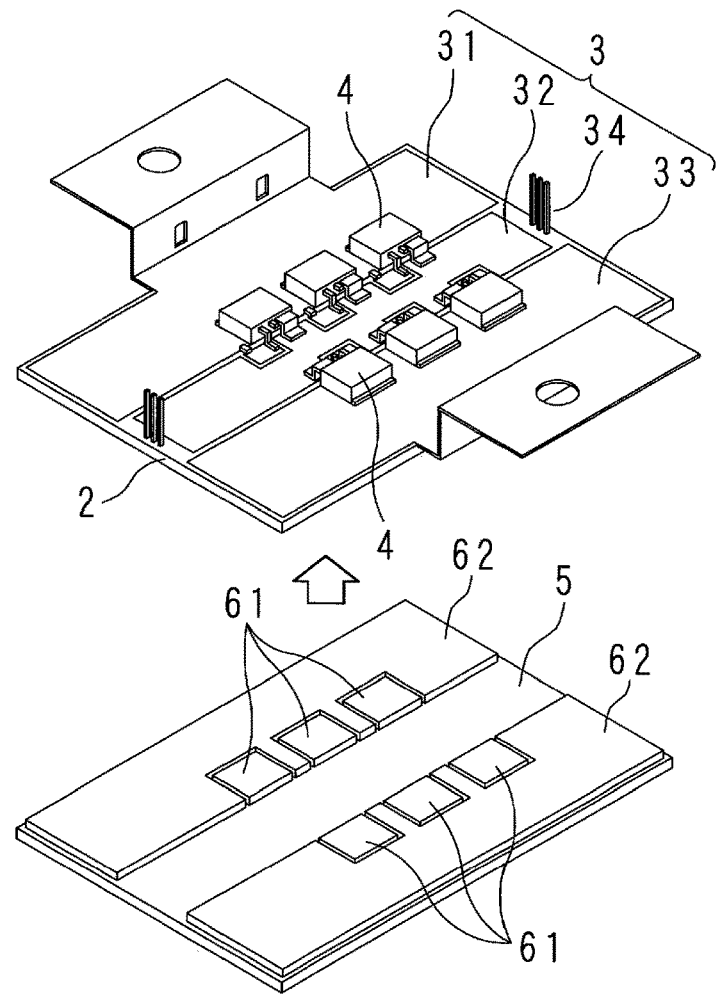
FIG. 8F is a diagram illustrating the method for manufacturing the circuit board.
Figure 8G:
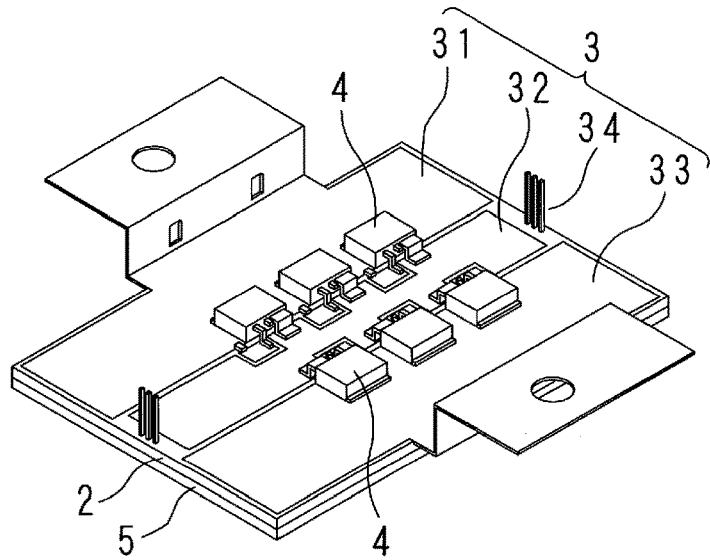
FIG. 8G is a diagram illustrating the method for manufacturing the circuit board.

Next, the heat dissipation plate 5 on which the heat conductive members 61 and 62 are applied on the one side is placed so as to oppose the side of the bus bars 3 and the holding member 2 formed in one piece on which the recesses 23 are formed, the rectangular shape of the heat dissipation plate 5 and the rectangular shape of the outer frame 21 of the holding member 2 are aligned and adhered to each other (see FIGS. 8F and 8G).

It is possible to manufacture the circuit board 1 on which the heat conductive members 61 and 62 are filled in the recesses 23 with a simple method in which the holding member 2 having the recesses 23 at positions corresponding to the circuit components 4 to be mounted is formed while forming a plurality of conductive plates and the holding member 2 in one piece, and the heat dissipation plate 5 on which the heat conductive members 61 and 62 are applied on the one side is attached to the surface of the plurality of conductive plates and the holding member 2 formed in one piece, on which the recesses 23 are formed. Since the recesses 23 are provided so that the circuit components 4 to be mounted overlap the recesses 23 in a plan view, the size of recesses 23 can be comparatively small corresponding to the size and shape of the circuit components 4, and when the circuit components 4 generate heat, an influence caused by the linear expansion coefficients of the parts included in the circuit board 1 can be decreased, making it possible to suppress pump-out of the heat conductive members 61 and 62.

The disclosed embodiments are illustrative examples in all aspects and should not be considered as restrictive. The scope of the present disclosure is defined not by the above description but by the claims, and is intended to encompass all modifications within the meanings and scope that are equivalent to the claims.

The invention claimed is:

1. A circuit board on which a circuit component is mounted on one side,
    wherein a recess is formed on the other side at a position corresponding to the circuit component, and
    the circuit board includes a first heat conductive member that is provided inside the recess and conducts heat generated by the circuit component; and
    wherein the circuit component includes a plurality of semiconductor switches, and a number of the recesses is at least the number of the semiconductor switches.

2. The circuit board according to claim 1, wherein at least a part of the circuit component overlaps the recess in a plan view.

3. The circuit board according to claim 2, comprising:
    a heat dissipation plate provided on the other side,
    wherein the first heat conductive member is sealed by the heat dissipation plate and the recess.

4. The circuit board according to claim 2, wherein the circuit component includes a plurality of semiconductor switches, and
    the number of the recesses is at least the number of the semiconductor switches.

5. The circuit board according to claim 2, wherein the recess is formed by a partitioning wall provided on the other side.

6. The circuit board according to claim 1, comprising:
    a heat dissipation plate provided on the other side,
    wherein the first heat conductive member is sealed by the heat dissipation plate and the recess.

7. The circuit board according to claim 6, wherein the circuit component includes a plurality of semiconductor switches, and the number of the recesses is at least the number of the semiconductor switches.

8. The circuit board according to claim 6, wherein the recess is formed by a partitioning wall provided on the other side.

9. The circuit board according to claim 1, wherein the recess is formed by a partitioning wall provided on the other side.

10. The circuit board according to claim 9, including:
    a heat dissipation plate provided on the other side; and
    a conductive plate on which a terminal of the circuit component is mounted,
    wherein the height of the partitioning wall is set so that a distance between the conductive plate and the heat dissipation plate is a predetermined insulation distance.

11. The circuit board according to claim 10, wherein a protrusion is formed along the circumferential edge of the other side, and
    a second heat conductive member is provided between an inner face of the protrusion and an outer wall face of the partitioning wall.

12. The circuit board according to claim 9, wherein a protrusion is formed along the circumferential edge of the other side, and
    a second heat conductive member is provided between an inner face of the protrusion and an outer wall face of the partitioning wall.

13. A method for manufacturing a circuit board including steps of:
    arranging a plurality of conductive plates at a predetermined position of a metal mold, injecting resin into the metal mold to form a holding member having a number of recesses that corresponds to a position of a corresponding number of circuit components to be mounted, while forming the plurality of conductive plates and the holding member in one piece, wherein the circuit component includes a plurality of semiconductor switches, and a number of the recesses is at least the number of the semiconductor switches;
    applying a conductive material in a region of the conductive plates on which a terminal of a circuit component is to be mounted;
    aligning the terminal of the circuit component with the conductive material and mounting the terminal of the circuit component on the conductive plate,
    introducing and heating, in a reflow furnace, the plurality of conductive plates and the holding member formed in one piece in a state where the circuit component is placed, melting the conductive material to solder the terminal of the circuit component to the conductive plate; and
    attaching the heat dissipation plate on which a heat conductive member is applied on one side to a surface of the plurality of conductive plates and the holding member formed in one piece, on which the recess is formed.

* * * * *